(12) United States Patent
Imanaka

(10) Patent No.: US 11,128,155 B2
(45) Date of Patent: Sep. 21, 2021

(54) PROTECTIVE APPARATUS FOR ENERGY STORAGE DEVICE

(71) Applicant: GS Yuasa International Ltd., Kyoto (JP)

(72) Inventor: Yuki Imanaka, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 111 days.

(21) Appl. No.: 16/619,365

(22) PCT Filed: May 29, 2018

(86) PCT No.: PCT/JP2018/020446
§ 371 (c)(1),
(2) Date: Dec. 4, 2019

(87) PCT Pub. No.: WO2018/225572
PCT Pub. Date: Dec. 13, 2018

(65) Prior Publication Data
US 2020/0161888 A1 May 21, 2020

(30) Foreign Application Priority Data
Jun. 5, 2017 (JP) .............................. JP2017-110909

(51) Int. Cl.
*H02J 7/00* (2006.01)
*H01M 10/42* (2006.01)

(52) U.S. Cl.
CPC ....... *H02J 7/00302* (2020.01); *H01M 10/425* (2013.01); *H02J 7/00306* (2020.01); *H01M 2010/4271* (2013.01)

(58) Field of Classification Search
CPC .................................................. H02J 7/00302
(Continued)

(56) References Cited

U.S. PATENT DOCUMENTS

2003/0132732 A1* 7/2003 Thomas .............. H02J 7/00308
320/134
2004/0189259 A1* 9/2004 Miura .................. H02J 7/0029
320/134
(Continued)

FOREIGN PATENT DOCUMENTS

CN 105743188 A 7/2016
JP H05-30653 A 2/1993
(Continued)

OTHER PUBLICATIONS

International Searching Authority, International Search Report and Written Opinion for International Application No. PCT/JP2018/020446, dated Jul. 10, 2018, (9 pages), Japanese Patent Office, Tokyo, Japan.

*Primary Examiner* — Yalkew Fantu
(74) *Attorney, Agent, or Firm* — Alston & Bird LLP

(57) ABSTRACT

A battery management system (BMS) is provided, which includes: an on-off switch provided in a current path connecting an assembled battery and electrical equipment; a controller that switches the on-off switch to an off-state when an abnormality in the assembled battery is expected; and a bypass route connected in parallel with the on-off switch and having at least one of a parasitic diode that allows current to flow only in a direction of charging the assembled battery and a parasitic diode that allows current to flow only in a direction of discharging the assembled battery. A second excitation coil is connected in series with the parasitic diode and the parasitic diode 50B in the bypass route, the second excitation coil switching the on-off switch to an on-state with magnetic flux by flow of current with a predetermined current value.

4 Claims, 7 Drawing Sheets

(58) Field of Classification Search
USPC .......................................................... 320/128
See application file for complete search history.

(56) References Cited

U.S. PATENT DOCUMENTS

| | | | |
|---|---|---|---|
| 2005/0077878 A1* | 4/2005 | Carrier ................ | H01M 10/441 |
| | | | 320/134 |
| 2005/0127878 A1* | 6/2005 | Geren .................. | H02J 7/0031 |
| | | | 320/134 |
| 2012/0068546 A1 | 3/2012 | Kuramochi et al. | |
| 2014/0320070 A1 | 10/2014 | Nakamoto et al. | |
| 2016/0285291 A1 | 9/2016 | Nakamoto et al. | |
| 2017/0214257 A1* | 7/2017 | Shiraishi ............... | H02J 7/0029 |

FOREIGN PATENT DOCUMENTS

| | | |
|---|---|---|
| JP | H09-140070 A | 5/1997 |
| JP | H10-257602 A | 9/1998 |
| JP | H11-113178 A | 4/1999 |
| JP | 2012-070055 A | 4/2012 |
| JP | 2014-217169 A | 11/2014 |
| JP | 2017-034894 A | 2/2017 |
| JP | 2017-135834 A | 8/2017 |
| JP | 2017-200338 A | 11/2017 |

* cited by examiner

PROTECTIVE APPARATUS FOR ENERGY STORAGE DEVICE

CROSS REFERENCE TO RELATED APPLICATIONS

This application is a national stage application, filed under 35 U.S.C. § 371, of International Application No. PCT/JP2018/020446, filed May 29, 2018, which claims priority to Japanese Application No. 2017-110909, filed Jun. 5, 2017, the contents of both of which as are hereby incorporated by reference in their entirety.

BACKGROUND

Technical Field

The present invention relates to a technique for protecting an energy storage device.

Description of Related Art

There is known a technique for permitting charge and discharge of an energy storage device while protecting the energy storage device from abnormalities such as overcharge and overdischarge (e.g., see JP-A-2014-217169). An energy storage apparatus described in Patent Document 1 includes a plurality of switches connected in parallel to each other and a rectifier device connected in series to any one switch, which are provided between electrical equipment and an energy storage device. In the energy storage apparatus, when it is determined that the energy storage device is not normal, the switch connected to the rectifier device is brought into a closed state (energized state) by transmitting a close command signal from a controller to the switch, and the other switch is brought into an open state (cutoff state).

According to the energy storage apparatus, when the rectifier device allows current to flow only in the direction of, e.g., charging the energy storage device, the energy storage device can be charged while the energy storage device can be protected from the overdischarge. On the other hand, when the rectifier device allows current to flow only in the direction of discharging the energy storage device, electric power can be supplied to the electrical equipment while the energy storage device can be protected from the overcharge.

BRIEF SUMMARY

The above energy storage apparatus described in Patent Document 1 brings the switch into the closed state by software's control to transmit a closing command signal from the controller to the switch. However, when the switch is brought into the closed state by the software's control, current consumption may increase.

Disclosed is a technique for quickly switching an on-off switch to an energized state while reducing current consumption for the switching, when the on-off switch is to be switched to the energized state after the on-off switch such as a switch is switched to a cutoff state in order to protect an energy storage device from abnormalities such as overcharge and overdischarge.

A protective apparatus for an energy storage device includes: an on-off switch provided in a current path connecting the energy storage device and electrical equipment; a controller that switches the on-off switch to a cutoff state when an abnormality in the energy storage device is expected; and a bypass route connected in parallel with the on-off switch and having at least one of a rectifier device that allows current to flow only in a direction of charging the energy storage device and a rectifier device that allows current to flow only in a direction of discharging the energy storage device. An excitation coil is connected in series with the rectifier device in the bypass route, the excitation coil switching the on-off switch to an energized state with magnetic flux by flow of current with a predetermined current value.

In order to protect an energy storage device from abnormalities such as overcharge and overdischarge, after an on-off switch is switched to a cutoff state, when the on-off switch is to be switched to an energized state, it is possible to quickly switch the on-off switch to the energized state, while reducing current consumption for the switching.

DETAILED DESCRIPTION OF VARIOUS EMBODIMENTS

Summary of the Present Embodiment

Figure 1:
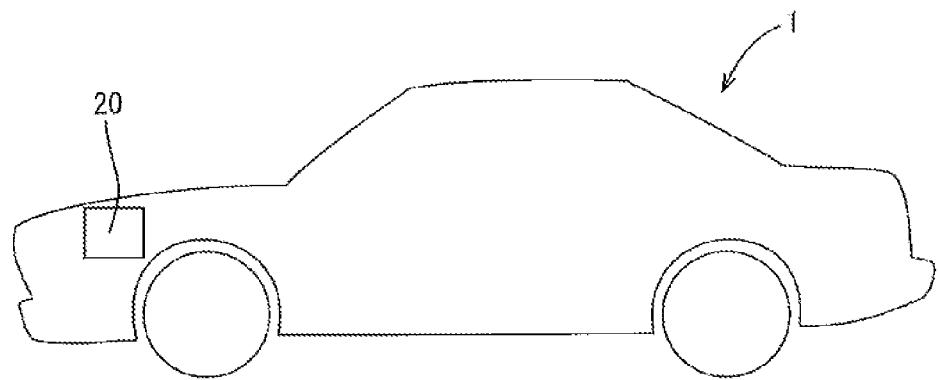
FIG. 1 is a schematic diagram showing an automobile and a battery according to a first embodiment.

A protective apparatus for an energy storage device includes: an on-off switch provided in a current path connecting the energy storage device and electrical equipment; a controller that switches the on-off switch to a cutoff state when an abnormality in the energy storage device is expected; and a bypass route connected in parallel with the on-off switch and having at least one of a rectifier device that allows current to flow only in a direction of charging the energy storage device and a rectifier device that allows current to flow only in a direction of discharging the energy storage device. An excitation coil may be connected in series with the rectifier device in the bypass route, the excitation coil switching the on-off switch to an energized state with magnetic flux by flow of current with a predetermined current value.

In a case where the rectifier device allows current to flow only in the direction of charging the energy storage device, the energy storage device can be protected from overdischarge by switching the on-off switch to the cutoff state when the overdischarge is expected. When a battery charger is connected in that state, charge is permitted by charge current flowing from the battery charger to the energy storage device via the rectifier device.

On the other hand, in a case where the rectifier device allows current to flow only in the direction of discharging the energy storage device, the energy storage device can be protected from overcharge by switching the on-off switch to the cutoff state when the overcharge is expected. When an electrical load is connected in that state, discharge current is allowed to flow from the energy storage device to the electrical load via the rectifier device, thereby permitting discharge.

When large current flows through the rectifier device, the rectifier device may be damaged. In that case, it is conceivable to prevent damage by using a rectifier device with a large maximum permissible current, but in general, the rectifier device with a large maximum permissible current is expensive and has an increased size. For this reason, when the current value of the current flowing through the rectifier device reaches the predetermined current value, the on-off switch is switched to the energized state so as to prevent the rectifier device from being damaged.

In that case, it is conceivable to periodically measure the current flowing through the rectifier device, and switch the on-off switch to the energized state when the predetermined current value is reached. It is conceivable to switch the on-off switch to the energized state by software's control. However, in order to quickly switch the on-off switch to the energized state when the current value reaches the predetermined current value, the current needs to be measured in a short cycle, and the current consumption increases.

When the current with the predetermined current value flows through the rectifier device, the on-off switch is switched to the energized state by an excitation coil, whereby it is possible to quickly switch the on-off switch to the energized state when the current value reaches the predetermined current value (i.e., when the on-off switch is to be switched to the energized state). Since it is not necessary to measure the current for switching the on-off switch in order to the energized state, the current consumption can be reduced as compared to a case where the current is measured in a short cycle.

With the on-off switch being switched to the energized state by hardware rather than software's control, in order to protect an energy storage device from abnormalities such as overcharge and overdischarge, after an on-off switch is switched to a cutoff state, when the on-off switch is to be switched to an energized state, it is possible to quickly switch the on-off switch to the energized state, while reducing current consumption for the switching.

A first parallel circuit in which a first switch and the rectifier device that allows current to flow only in the direction of charging the energy storage device are connected in parallel, and a second parallel circuit in which a second switch and the rectifier device that allows current to flow only in the direction of discharging the energy storage device are connected in parallel are provided in series in the bypass route. When the overcharge of the energy storage device is expected, the controller may bring the first switch into the energized state and the second switch into the cutoff state.

It is possible to supply electric power to the electrical load while protecting the energy storage device from the overcharge.

A first parallel circuit in which a first switch and the rectifier device that allows current to flow only in the direction of charging the energy storage device are connected in parallel, and a second parallel circuit in which a second switch and the rectifier device that allows current to flow only in the direction of discharging the energy storage device are connected in parallel are provided in series in the bypass route. When the overdischarge of the energy storage device is expected, the controller may bring the first switch into the cutoff state and the second switch into the energized state.

It is possible to charge the energy storage device while protecting the energy storage device from the overdischarge.

The second switch is a normally open non-latching switch. A latching auxiliary on-off switch is provided in parallel with the second switch in the bypass route. The controller may switch the auxiliary on-off switch to the energized state when switching the second switch to the energized state.

When the overdischarge is expected, the remaining battery level is low. Thus, when the second switch is brought into the energized state, if the state continues for a long time, there is a possibility that the electric power of the energy storage device becomes insufficient along the way and the second switch comes into the cutoff state. When the second switch comes into the cutoff state, the energy storage device cannot be charged. In contrast, since the auxiliary on-off switch is a latch type, electric power for maintaining the energized state is unnecessary, and the energized state is maintained even when the electric power of the energy storage device becomes insufficient. For this reason, even when the second switch comes into the cutoff state, the energy storage device can be charged via the auxiliary on-off switch.

The present embodiment can be realized in various modes such as a protective apparatus for an energy storage device, a method for protecting an energy storage device, a computer program for realizing the function of the apparatus or the method, and a recording medium on which the computer program is recorded.

First Embodiment

A first embodiment will be described with reference to FIGS. 1 to 8. In the following description, referring to FIGS. 2 and 3, a vertical direction of a battery case 21 at the time when the battery case 21 is placed horizontally without being inclined with respect to the installation surface is taken as the Y-direction, a direction along the long side of the battery case 21 is taken as the X-direction, and the depth direction of the battery case 21 is taken as the Z-direction.

(1) Structure of Battery

As shown in FIG. 1, a battery 20 is mounted on an automobile 1 such as an electric car or a hybrid car, and supplies electric power to an electrical load 3 (cf. FIG. 4) such as a power source that operates with electric energy.

Figure 2:
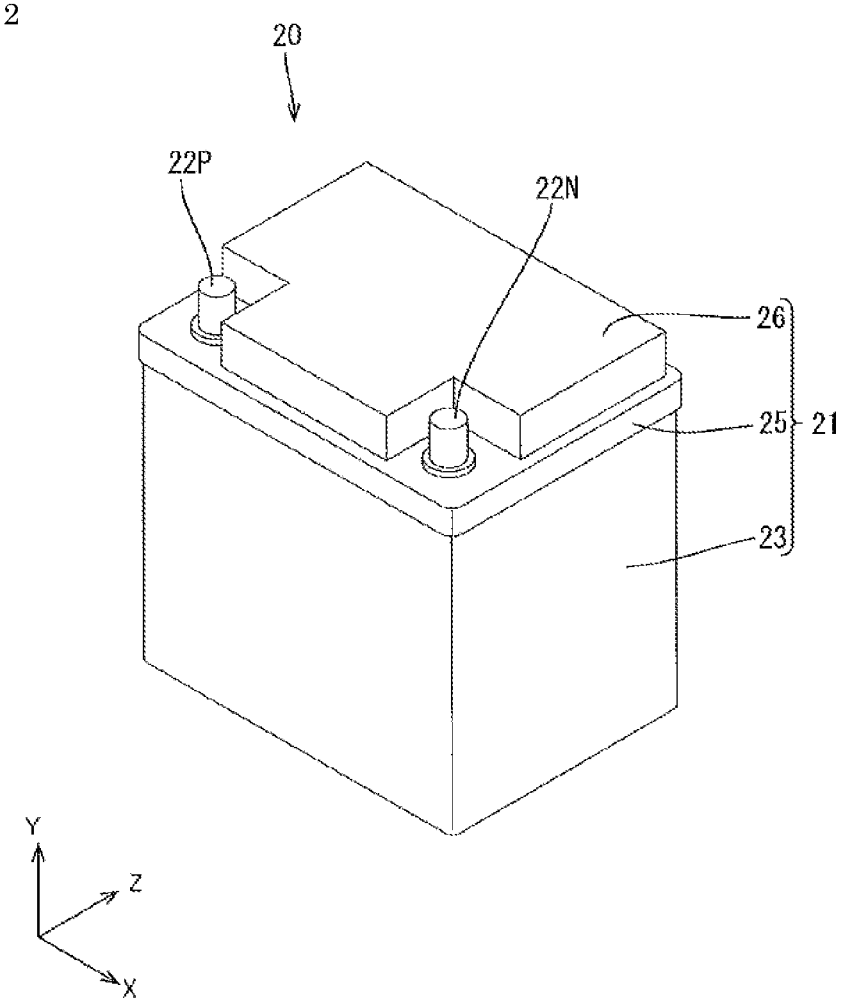
FIG. 2 is a perspective view of the battery.
Figure 3:
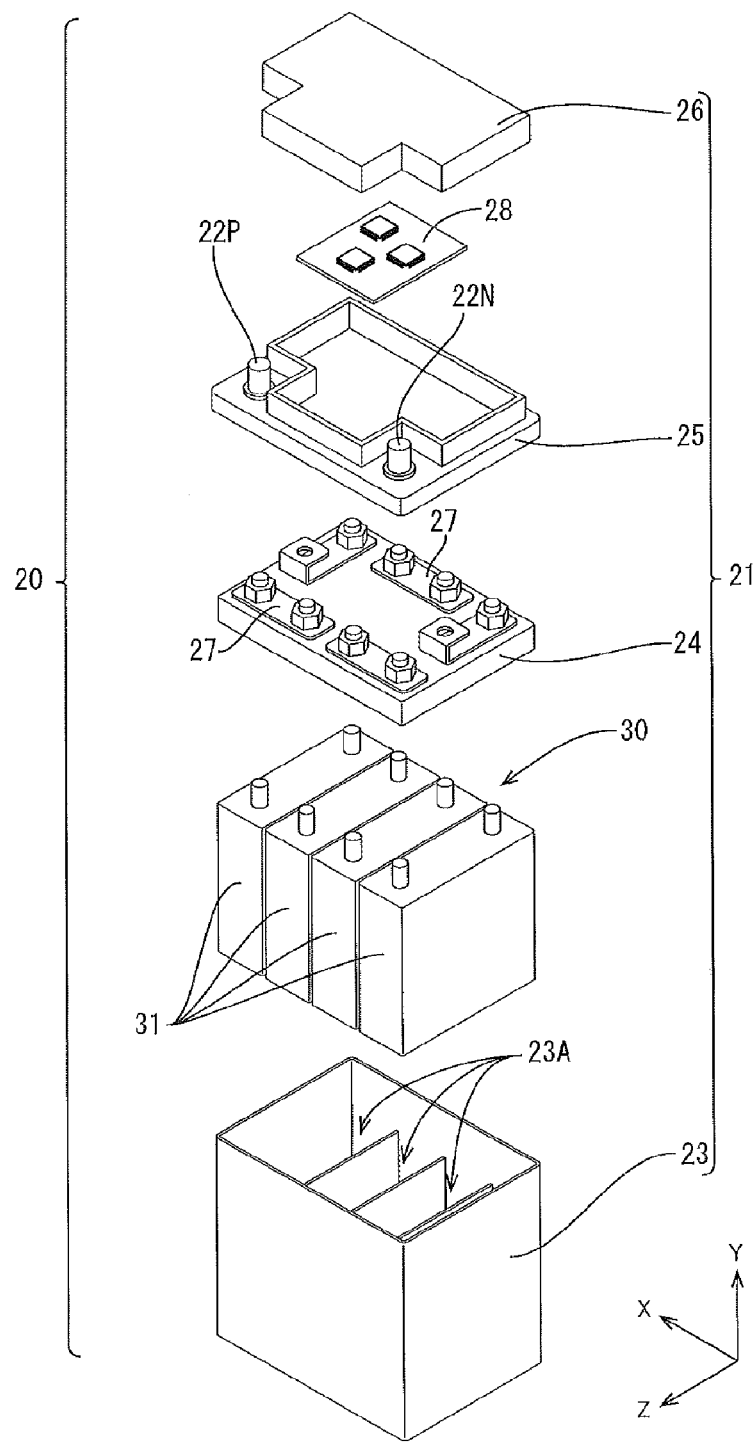
FIG. 3 is an exploded perspective view of the battery.

As shown in FIG. 2, the battery 20 has a block-shaped battery case 21. As shown in FIG. 3, the battery case 21 accommodates an assembled battery 30 with a plurality of battery cells 31 connected in series, a control board 28, and the like. The assembled battery 30 is an example of an energy storage device. The battery case 21 includes a box-shaped case body 23 that opens upward, a positioning member 24 that positions the plurality of battery cells 31, an inner lid 25 attached to an upper portion of the case body 23, and an upper lid 26 attached to the upper portion of the inner lid 25.

In the case body 23, a plurality of cell chambers 23A individually accommodating the battery cells 31 are provided side by side in the X-direction. In the positioning member 24, a plurality of bus bars 27 are arranged on the upper surface, and by placement of the positioning member 24 on upper portions of the plurality of battery cells 31 arranged in the case body 23, the plurality of battery cells 31 are positioned and are connected in series by a plurality of bus bars 27.

The inner lid 25 has a substantially rectangular shape in plan view and has a height difference in the Y-direction. A positive terminal 22P and a negative terminal 22N connected with harness terminals (not shown) are provided at both ends in the X-direction of the inner lid 25. The control board 28 is accommodated in the inner lid 25, and by attachment of the inner lid 25 to the case body 23, the assembled battery 30 and the control board 28 are connected.

(2) Electrical Configuration of Battery

The electrical configuration of the battery 20 will be described with reference to FIG. 4. The battery 20 includes the assembled battery 30 and a battery management system (BMS) 40. The BMS 40 is an example of a protective apparatus for an energy storage device.

As described above, the assembled battery 30 includes the plurality of battery cells 31 connected in series. Each battery cell 31 is a rechargeable secondary battery, specifically, for example, an iron phosphate lithium ion battery using an iron phosphate material for the positive electrode and graphite for the negative electrode. The assembled battery 30 is provided in a current path 41 that connects the positive electrode terminal 22P and the negative electrode terminal 22N, and is selectively connected to a battery charger 3 provided inside or outside the automobile 1 and to the electrical load 3 provided inside the automobile 1 via the positive terminal 22P and the negative terminal 22N. The battery charger 3 and the electrical load 3 are examples of electrical equipment.

The BMS 40 includes a controller 42, a current sensor 43, a voltage sensor 44, an analog-to-digital converter 45 (hereinafter referred to as ADC 45), a relay L1, and a bypass route 46.

The controller 42 operates with electric power supplied from the assembled battery 30. The controller 42 includes a central processing unit 42A (hereinafter referred to as CPU 42A), a read-only memory (ROM) 42B, a random-access memory (RAM) 42C, and the like. Various control programs are stored in the ROM 42B. The CPU 42A executes a control program stored in the ROM 42B to perform processing for estimating a state of change (SOC) of the assembled battery 30 and processing for protecting the assembled battery 30 from abnormalities such as overcharge and overdischarge. The SOC is also called a state of charge or a charging rate and represents, as a ratio, an amount of electricity being charged with respect to an electric capacity.

The current sensor 43 is provided in the current path 41 in series with the assembled battery 30. The current sensor 43 measures a current value I [A] of each of charge current flowing from the battery charger 3 to the assembled battery 30 during charge and discharge current flowing from the assembled battery 30 to the electrical load 3 during discharge. An analog measurement signal SG1 corresponding to the measured current value I is output to the ADC 45. In the following description, the charge current and the discharge current are referred to as charge-discharge current when not distinguished from each other.

The voltage sensor 44 is connected to both ends of each battery cell 31 of the assembled battery 30. The voltage sensor 44 detects a voltage value V [V] that is a terminal voltage of the battery cell 31 and outputs an analog measurement signal SG2 corresponding to the detected voltage value V to the ADC 45. The ADC 45 converts the measurement signals SG1, SG2, output from the current sensor 43 and the voltage sensor 44, from analog signals to digital signals and outputs digital data indicating the current value I and the voltage value V to the controller 42.

The relay L1 is provided in the current path 41 in series with the assembled battery 30. The relay L1 includes a latching on-off switch 47 and a first excitation coil 48 that switches the on-off switch 47 to an off state (cutoff state, open state) with magnetic flux. The relay L1 is not limited to the one that switches the on-off switch 47 to the off-state with the magnetic flux.

The bypass route 46 is provided in the current path 41 in parallel with the relay L1. The bypass route 46 includes a charging field-effect transistor (FET) 49, a discharging FET 50, a second excitation coil 51, and an auxiliary relay L2. The charging FET 49 is an example of a first parallel circuit. The discharging FET 50 is an example of a second parallel circuit. The second excitation coil 51 is an example of an excitation coil. The auxiliary relay L2 is an example of an auxiliary on-off switch.

The charging FET 49 and the discharging FET 50 are provided in series with each other in the bypass route 46. The charging FET 49 includes a semiconductor switch 49A and a parasitic diode 49B that is provided in parallel with the semiconductor switch 49A and allows current to flow only in the direction of charging the assembled battery 30. The semiconductor switch 49A is a normally open non-latching switch, and is in an on-state (energized state, closed state) only during supply of electric power. The parasitic diode 49B is an example of a rectifier device that allows current to flow only in the direction of charging the energy storage device. The semiconductor switch 49A is an example of a first switch.

The discharging FET 50 includes a semiconductor switch 50A and a parasitic diode 50B that is provided in parallel with the semiconductor switch 50A and allows current to flow only in the discharging direction. The semiconductor switch 50A is also a normally open non-latching switch, and is in the on-state only during supply of electric power. The parasitic diode 50B is an example of a rectifier device that allows current to flow only in the direction of discharging the energy storage device. The semiconductor switch 50A is an example of a second switch.

The second excitation coil 51 is provided in the bypass route 46 in series with the charging FET 49 and the discharging FET 50. The second excitation coil 51 is disposed in the vicinity of the on-off switch 47, and when current with a predetermined current value flows, the on-off switch 47 is switched to the on-state with magnetic flux. The predetermined current value is a current value that does not damage the parasitic diode 49B or 50B.

Current can be supplied to the second excitation coil 51 through a path (not shown), and the on-off switch 47 may be switched to the on-state by supply of current to the second excitation coil 51.

The auxiliary relay L2 is a latching relay and is provided in the bypass route 46 in parallel with the discharging FET 50.

(3) Estimation of SOC

As described above, the controller 42 estimates the SOC of the assembled battery 30. A current integration method will be described as an example for estimating the SOC. The current integration method is a method in which the charge-discharge current of the battery is constantly measured to measure an amount of electric power getting into and out of the battery, and the amount of electric power is increased or decreased from an initial capacity to estimate the SOC. The current integration method has an advantage in being able to estimate that the SOC even when the battery is in use. On the other hand, since current is constantly measured and a charge-discharge watt-hour is integrated, an error in measurement by the current sensor 43 may accumulate and the obtained value may become increasingly inaccurate.

A reset of the SOC, estimated by the current integration method, based on the open circuit voltage (OCV) of the battery (also referred to as OCV-reset) has also be performed. This is a technique in which, using the fact that there is a relatively precise correlation between the OCV and the SOC when no current is flowing through the battery, a battery voltage (OCV) at the time when no current is flowing through the battery is measured, and with reference to a correlation between an OCV and a SOC stored in advance, the SOC corresponding to the measured OCV is obtained, and the SOC estimated by the current integration method is corrected. When the OCV-reset is performed, the accumulation of the error in the current integration method is discontinued, so that the SOC estimation accuracy can be improved.

(4) Protection of Assembled Battery

The controller 42 determines the state of the assembled battery 30 from the estimated SOC, and when an abnormality such as overcharge or overdischarge is expected, the controller 42 protects the assembled battery 30 from the abnormality.

(4-1) Expectation of Abnormality in Assembled Battery

For example, it is assumed that the overcharge has occurred when the SOC is 90% or more, and the overdischarge has occurred when the SOC is 10% or less. In this case, the controller 42 determines that the overcharge is close when the SOC increases to 85%. That is, the overcharge is expected by the controller 42. Further, the controller 42 determines that the overdischarge is close when the SOC decreases to 15%. That is, the overdischarge is expected by the controller 42.

Each value described above is an example, and a value serving as a reference for the overcharge or the overdischarge, or a value used as a reference for the determination that the overcharge or the overdischarge is close, is not limited to the above-described value.

(4-2) Operation when No Abnormality is Expected

Figure 4:
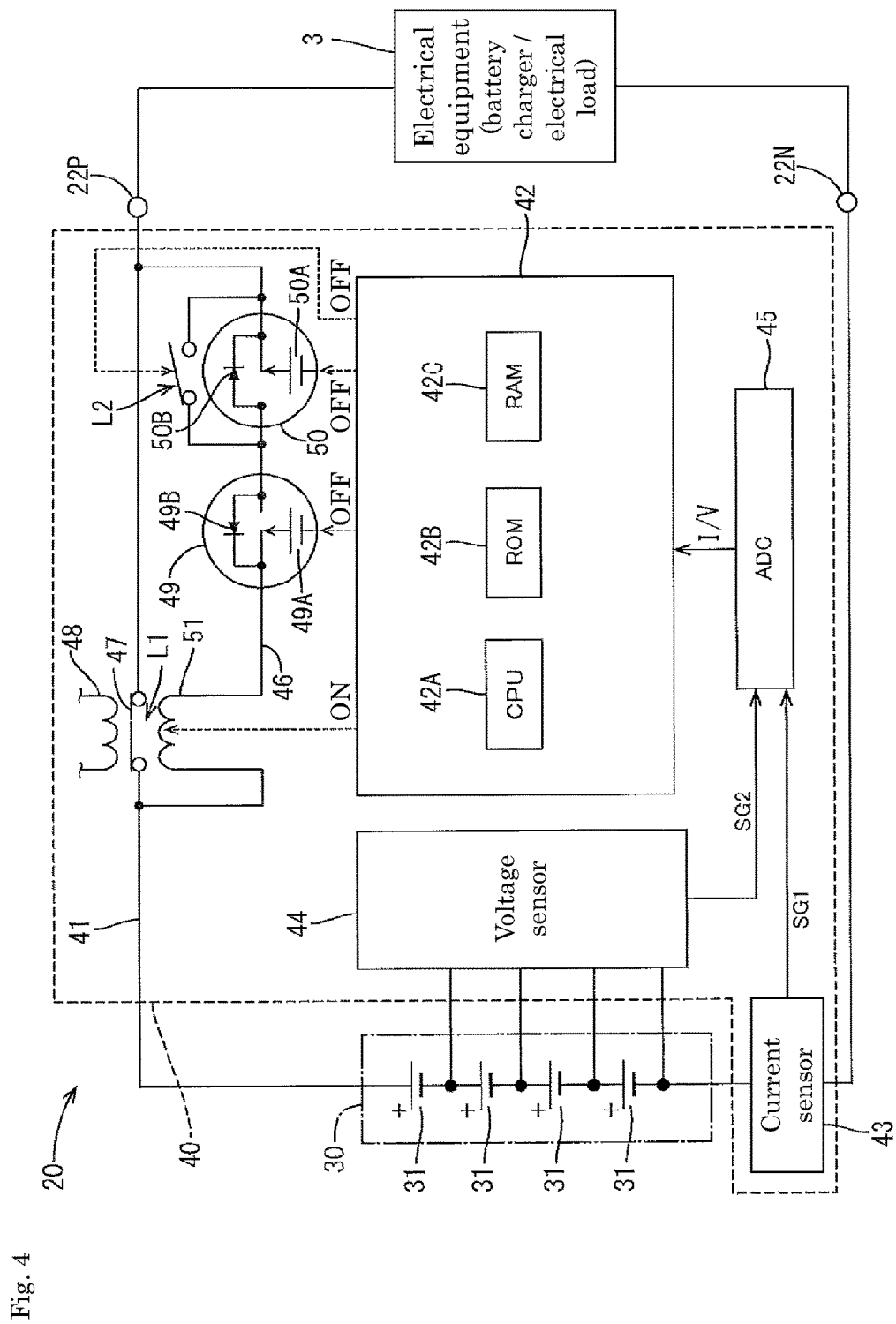
FIG. 4 is a circuit diagram of the battery (when no abnormality is expected).

As shown in FIG. 4, when the abnormality such as overcharge or overdischarge is not expected, that is, when the assembled battery 30 is normal, the controller 42 turns on the on-off switch 47 to switch the semiconductor switch 49A, the semiconductor switch 50A, and the auxiliary relay L2 to the off state.

(4-3) Operation when Overcharge is Expected

Figure 5:
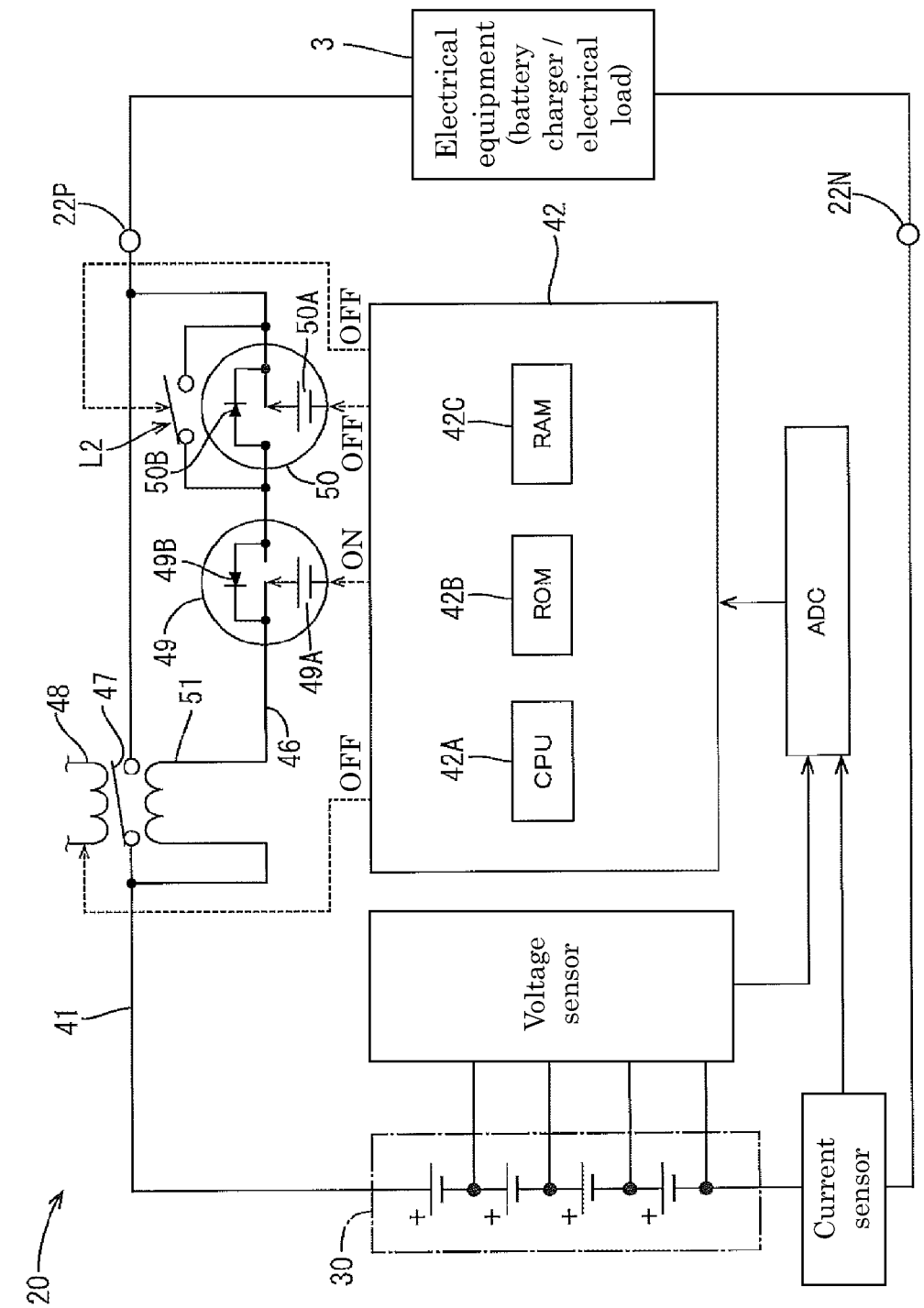
FIG. 5 is a circuit diagram of the battery (when overcharge is expected: the on-off switch is off).

As shown in FIG. 5, when the overcharge of the assembled battery 30 is expected, the controller 42 performs the following operation so as to protect the assembled battery 30 from the overcharge.

(a1) Energizing the first excitation coil 48 to switch the on-off switch 47 to the off state.

(a2) The semiconductor switch 49A of the charging FET 49 is switched to the on-state.

By performing the operation (a1) described above, the charge current is prevented from flowing from the battery charger 3 to the assembled battery 30 via the current path 41. Since the semiconductor switch 50A of the discharging FET 50 is kept off, the charge current is also prevented from flowing from the battery charger 3 to the assembled battery 30 via the bypass route 46. Thereby, the assembled battery 30 is protected from the overcharge.

When the electrical load 3 is connected to the battery 20 in a state where the assembled battery 30 is protected from the overcharge by performing the operation (a2) described above, discharge current flows from the assembled battery 30 to the electrical load 3 via the semiconductor switch 49A of the charging FET 49 and the parasitic diode 50B of the discharging FET 50. For this reason, even in a state where the assembled battery 30 is protected from the overcharge, power failure (interruption of electric power supply) in which electric power is not supplied to the electrical load 3 is prevented.

Figure 6:
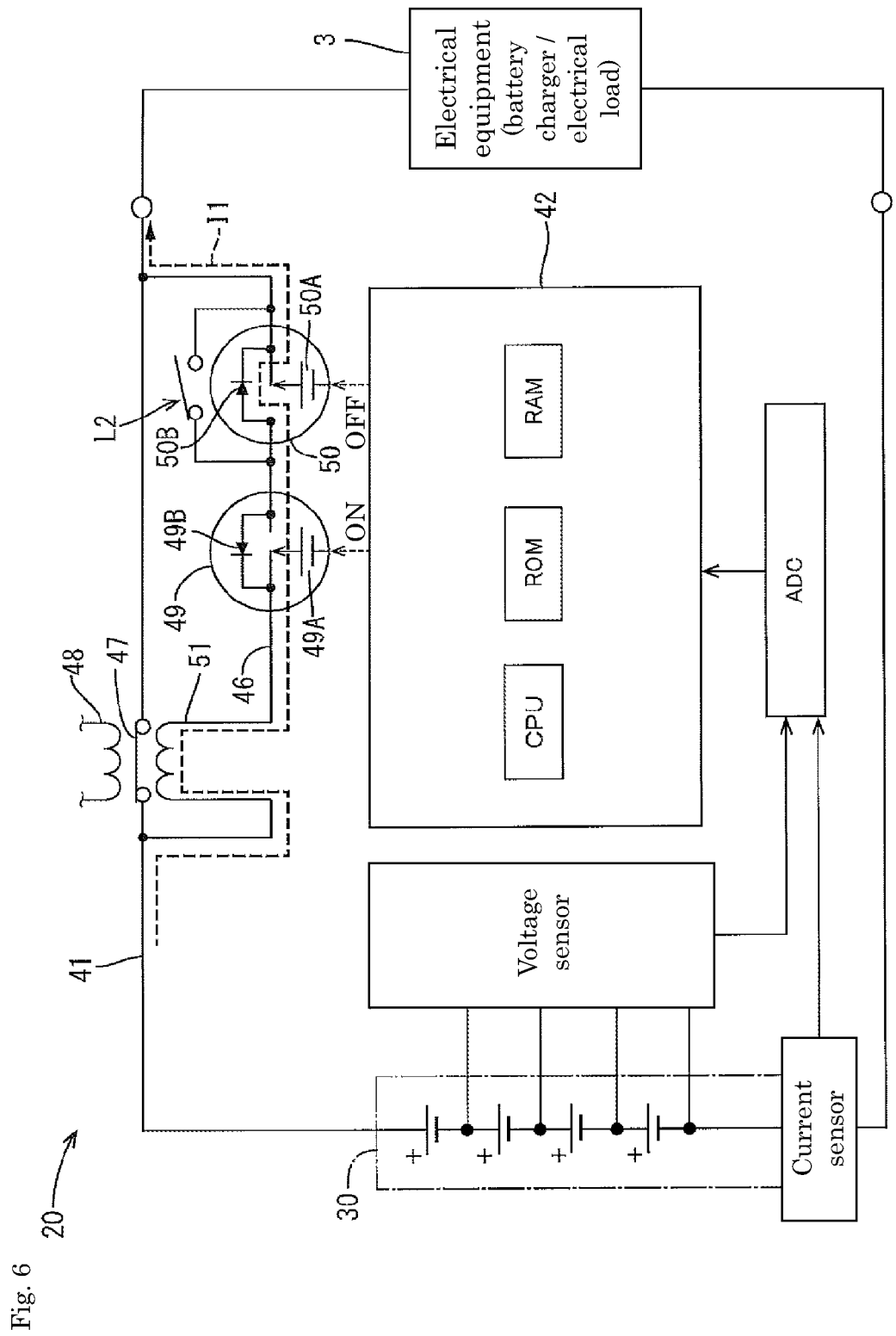
FIG. 6 is a circuit diagram of the battery (when overcharge is expected: the on-off switch is on).

As shown in FIG. 6, during the flow of discharge current I1 from the assembled battery 30 to the electrical load 3 via the semiconductor switch 49A and the parasitic diode 50B, when the discharge current I1 gradually increases and reaches the predetermined current value described above, the on-off switch 47 is switched to the on-state by the second excitation coil 51. This prevents the parasitic diode 50B from being damaged by large current flowing through the parasitic diode 50B.

(4-4) Operation when Overdischarge is Expected

Figure 7:
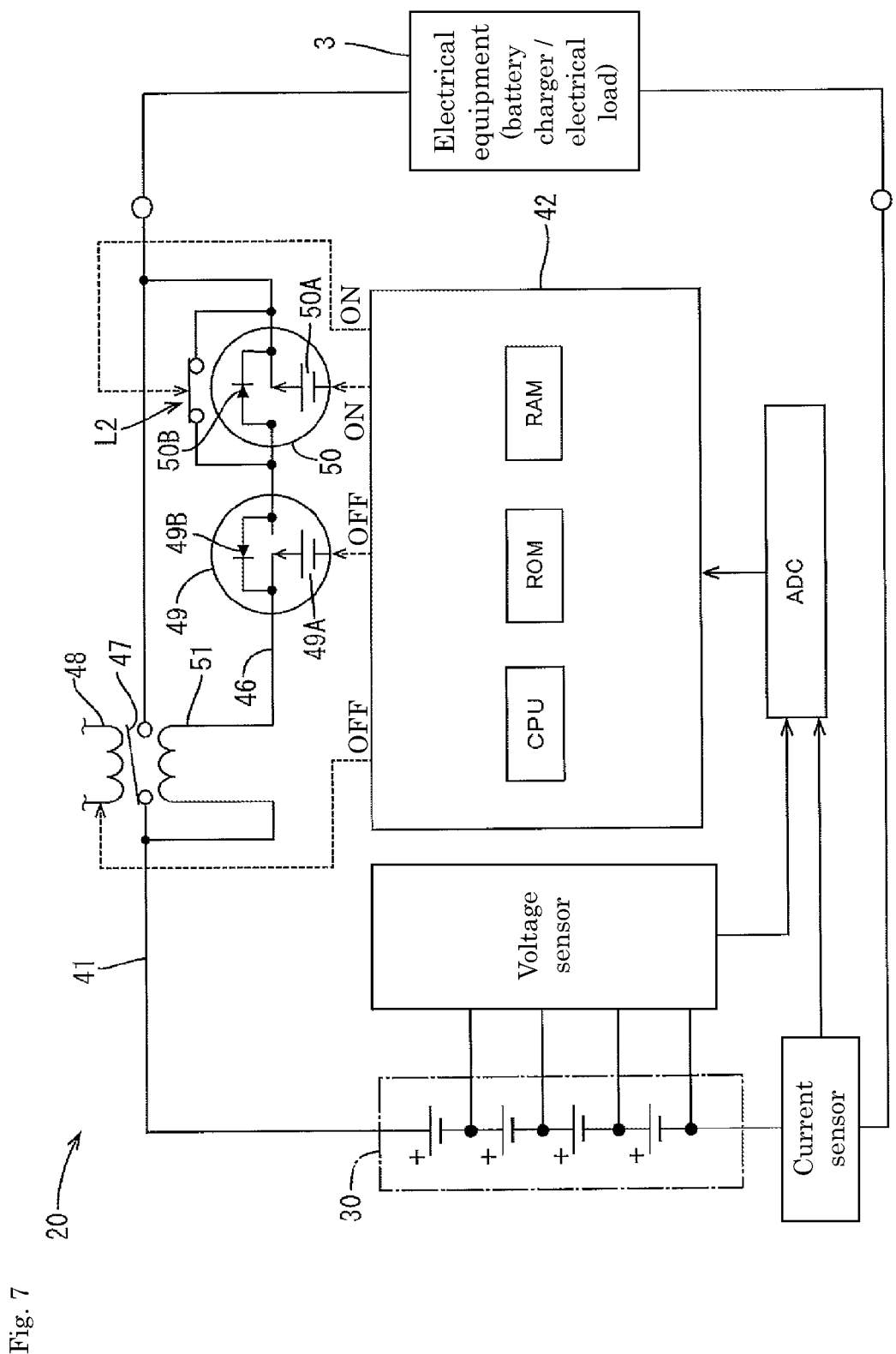
FIG. 7 is a circuit diagram of the battery (when overdischarge is expected: the on-off switch is off).

As shown in FIG. 7, when the overdischarge of the assembled battery 30 is expected, the controller 42 performs the following operation so as to protect the assembled battery 30 from the overdischarge.

(b1) Energize the first excitation coil 48 to switch the on-off switch 47 to the off-state.

(b2) Switch the semiconductor switch 50A of the discharging FET 50 to the on-state.

(b3) Switch the auxiliary relay L2 to the on-state.

By performing the operation (b1) described above, the discharge current is prevented from flowing from the assembled battery 30 to the electrical load 3 via the current path 41. Since the semiconductor switch 49A of the charging FET 49 is kept off, the discharge current is also prevented from flowing from the assembled battery 30 to the electrical load 3 via the bypass route 46. Thereby, the assembled battery 30 is protected from the overdischarge.

When the battery charger 3 is connected to the battery 20 in a state where the assembled battery 30 is protected from the overdischarge by performing the operation (b2) described above, charge current flows from the battery charger 3 to the assembled battery 30 via the semiconductor switch 50A of the discharging FET 50 and the parasitic diode 49B of the charging FET 49. For this reason, the assembled battery 30 can be charged even in a state where the assembled battery 30 is protected from the overdischarge.

Figure 8:
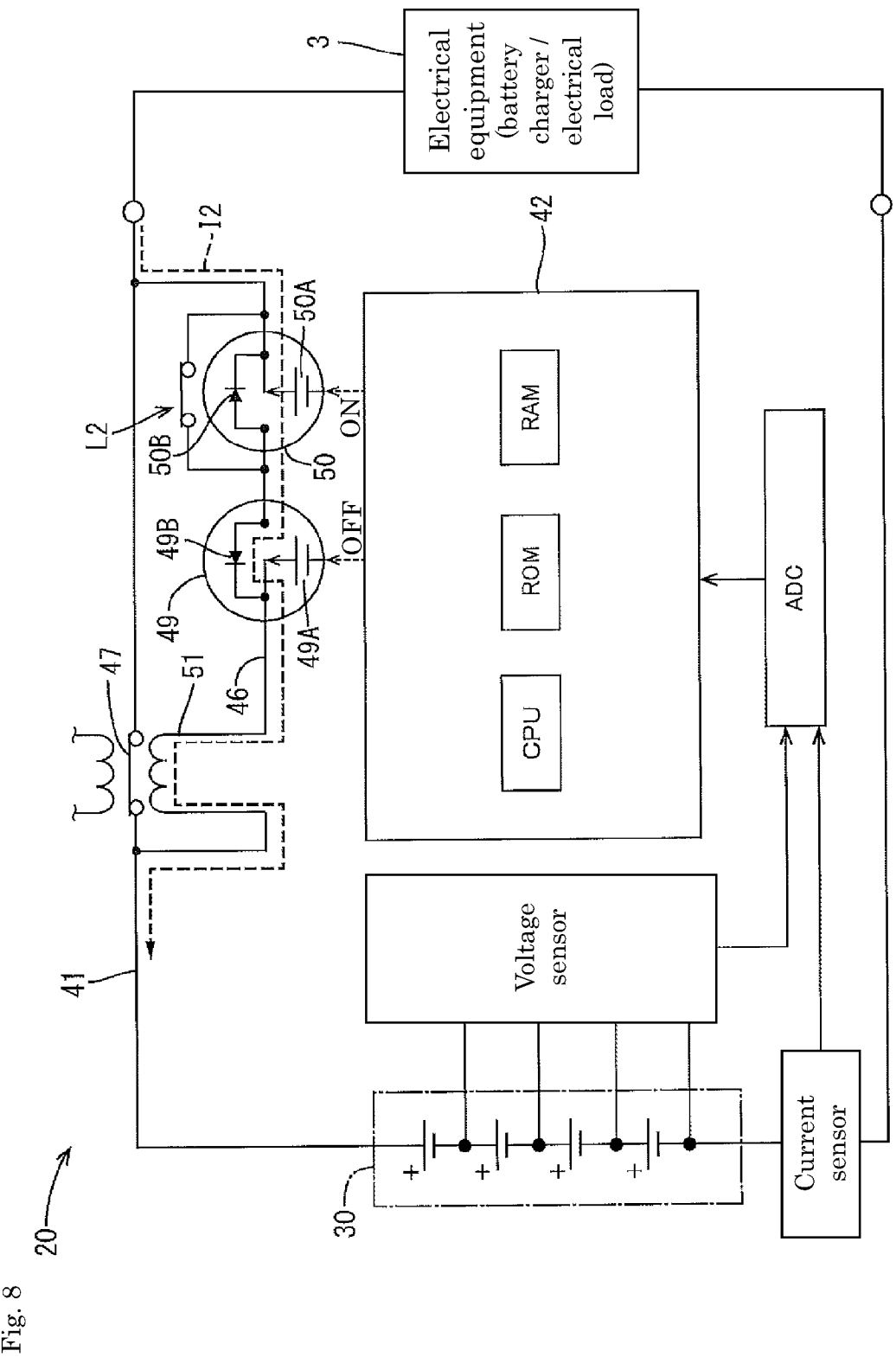
FIG. 8 is a circuit diagram of the battery (when overdischarge is expected: the on-off switch is on).

As shown in FIG. 8, during the flow of charge current I2 from the battery charger 3 to the assembled battery 30 via the semiconductor switch 50A and the parasitic diode 49B, when the charge current I2 gradually increases and reaches the predetermined current value described above, the on-off switch 47 is switched to the on-state by the second excitation coil 51. This prevents the parasitic diode 49B of the charging FET 49 from being damaged by large current flowing through the parasitic diode 49B.

As shown in FIG. 7, since the controller 42 also performs the operation (b3), the auxiliary relay L2 is switched to the on-state. When the overdischarge is expected, the remaining battery level is low. Thus, when the semiconductor switch 50A of the discharging FET 50 is switched to the on-state by the operation (b2), if the state continues for a long time, the electric power of the assembled battery 30 may become insufficient along the way, and the semiconductor switch 50A may be turned off. When the semiconductor switch 50A is turned off, the assembled battery 30 cannot be charged.

In contrast, since the auxiliary relay L2 is a latch type, electric power for maintaining the on-state is unnecessary, and the on-state is maintained even when the electric power of the assembled battery 30 becomes insufficient. For this reason, even when the semiconductor switch 50A is turned off, the assembled battery 30 can be charged via the auxiliary relay L2.

(5) Effects of the Embodiment

According to the BMS 40 in the first embodiment described above, the on-off switch 47 is switched to the on-state by the second excitation coil 51 when the current value of the current flowing through the bypass route 46 reaches a predetermined current value. Thereby, when the current value reaches the predetermined current value (i.e., when the on-off switch 47 is to be switched to the on-state), the on-off switch 47 can be quickly switched to the on-state. In the BMS 40, it is unnecessary to measure the current for switching the on-off switch 47 in order to the energized state, so that current consumption can be reduced as compared to a case where the current is measured in a short cycle. According to the BMS 40, since the on-off switch 47 is switched to the on-state by hardware rather than software's control, when the on-off switch 47 is to be switched to the on-state, it is possible to quickly switch the on-off switch 47 to the on-state, while reducing the current consumption.

When the on-off switch 47 is switched on by software's control, there is a concern that the operation becomes unstable due to a defect in the software. Since the BMS 40 is switched to the on-state by hardware, the on-off switch 47 can be stably switched to the on-state.

According to the BMS 40, it is possible to supply electric power to the electrical load 3 while protecting the assembled battery 30 from the overcharge.

According to the BMS 40, it is possible to charge the assembled battery 30 while protecting the assembled battery 30 from the overdischarge.

According to BMS 40, since the auxiliary relay L2 is switched to the on-state when the semiconductor switch 50A of the discharging FET 50 is switched to the on-state, even when the electric power of the assembled battery 30 becomes insufficient and the semiconductor switch 50A is turned off, the assembled battery 30 can be charged via the auxiliary relay L2.

Other Embodiments

The technology disclosed in the present specification is not limited to the embodiment described with reference to the above description and drawings, but includes, for example, the following various aspects.

(1) In the above embodiment, the assembled battery 30 has been described as an example of the energy storage device. However, the energy storage device may be configured of one battery cell 31 or may be a plurality of battery cells 31 connected in series or connected in parallel.

(2) In the above embodiment, the iron phosphate lithium ion battery has been described as an example of the energy storage device. However, the energy storage device is not limited to the iron phosphate lithium ion battery but may be another secondary battery such as a manganese lithium ion battery, a titanium lithium ion including titanium in a negative electrode, or a lead-acid battery. Furthermore, the energy storage device is not limited to a secondary battery but may be a capacitor.

(3) In the above embodiment, the case where the charging FET 49 (first parallel circuit) and the discharging FET 50 (second parallel circuit) are provided in the bypass route 46 has been described as an example. However, only one of the rectifier device through which current flows only in the direction of charging the energy storage device and the rectifier device through which the current flows only in the direction of discharging the energy storage device may be provided.

(4) In the above embodiment, the charging FET 49 has been described as an example of the first parallel circuit. However, the first parallel circuit may not be a FET so long as the rectifier device and the first switch are provided in parallel. In that case, the first switch is not necessarily a semiconductor switch but may be a mechanical relay, for example. The same applies to the second parallel circuit.

(5) In the above embodiment, the case where the auxiliary relay L2 is provided in the bypass route 46 has been described as an example. However, the auxiliary relay L2 may not be provided.

(6) In the above embodiment, the controller 42 having one CPU 42A has been described as an example of the controller 42. However, the configuration of the controller 42 is not limited to this. For example, the controller 42 may have a configuration including a plurality of CPUs, a configuration including a hardware circuit such as an application specific integrated circuit (ASIC) or a field-programmable gate array (FPGA), or a configuration including both the hardware circuit and CPUs.

(7) The above embodiment may be used for a second battery (backup battery) of a vehicle. The second battery (backup battery) is a battery for assisting the main battery and is used to prevent the power supply to the vehicle from being interrupted when the main battery is turned off (power is lost) for some reason. The second battery is maintained at full charge (SOC is a predetermined value or more). When the present invention is used for the second battery, the on-off switch can be turned off without monitoring for preventing the second battery from being overcharged. When the main battery is turned off (power is lost), the on-off switch is automatically turned on, so that it is possible to prevent the power supply to the vehicle from being interrupted.

(8) The above embodiment may also be used for an auxiliary battery of the vehicle. The auxiliary battery is used as a 12V power source for driving a light or ECU of a hybrid vehicle (HEV). When the power source (alternator) of the vehicle breaks down, the on-off switch is automatically turned on, so that it is possible to prevent the power supply to the vehicle from being interrupted.

DESCRIPTION OF REFERENCE SIGNS

3: Electrical equipment
30: Assembled battery
40: Battery management system (an example of a protective apparatus for an energy storage device)
41: Current path
42: Controller
46: Bypass route
47: On-off switch
49: Charging FET (an example of a first parallel circuit)
49A: Semiconductor switch (an example of a first switch)
49B: Parasitic diode (an example of a rectifier device that allows current to flow only in the direction of charging the energy storage device)
50: Discharging FET (an example of a second parallel circuit)
50A: Semiconductor switch (an example of a second switch)
50B: Parasitic diode (an example of a rectifier device that allows current to flow only in the direction of discharging the energy storage device)
51: Second excitation coil (an example of an excitation coil)

L2: Auxiliary relay (an example of an auxiliary on-off switch)

The invention claimed is:

1. A protective apparatus for an energy storage device, comprising:
   an on-off switch provided in a current path connecting the energy storage device and electrical equipment;
   a controller that switches the on-off switch to a cutoff state when an abnormality in the energy storage device is expected; and
   a bypass route connected in parallel with the on-off switch and having at least one of a rectifier device that allows current to flow only in a direction of charging the energy storage device and a rectifier device that allows current to flow only in a direction of discharging the energy storage device,
   wherein an excitation coil is connected in series with the rectifier device in the bypass route, the excitation coil switching the on-off switch to an energized state with magnetic flux by flow of current with a predetermined current value.

2. The protective apparatus for an energy storage device according to claim 1, wherein:
   a first parallel circuit in which a first switch and the rectifier device that allows current to flow only in the direction of charging the energy storage device are connected in parallel, and a second parallel circuit in which a second switch and the rectifier device that allows current to flow only in the direction of discharging the energy storage device are connected in parallel are provided in series in the bypass route, and
   when overcharge of the energy storage device is expected, the controller brings the first switch into the energized state and the second switch into the cutoff state.

3. The protective apparatus for an energy storage device according to claim 1, wherein:
   a first parallel circuit in which a first switch and the rectifier device that allows current to flow only in the direction of charging the energy storage device are connected in parallel, and a second parallel circuit in which a second switch and the rectifier device that allows current to flow only in the direction of discharging the energy storage device are connected in parallel are provided in series in the bypass route, and
   when over-discharge of the energy storage device is expected, the controller brings the first switch into the cutoff state and the second switch into the energized state.

4. The protective apparatus for an energy storage device according to claim 3, wherein:
   the second switch is a normally open non-latching switch,
   a latching auxiliary on-off switch is provided in parallel with the second switch in the bypass route, and
   the controller switches the auxiliary on-off switch to the energized state when switching the second switch to the energized state.

* * * * *